United States Patent
Uto et al.

(10) Patent No.: US 10,333,012 B2
(45) Date of Patent: Jun. 25, 2019

(54) METHOD FOR MANUFACTURING CRYSTALLINE SILICON SUBSTRATE FOR SOLAR CELL, METHOD FOR MANUFACTURING CRYSTALLINE SILICON SOLAR CELL, AND METHOD FOR MANUFACTURING CRYSTALLINE SILICON SOLAR CELL MODULE

(71) Applicant: KANEKA CORPORATION, Osaka-shi, Osaka (JP)

(72) Inventors: Toshihiko Uto, Settsu (JP); Takashi Suezaki, Settsu (JP); Wataru Yoshida, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 15/560,596

(22) PCT Filed: Jan. 22, 2016

(86) PCT No.: PCT/JP2016/051852
§ 371 (c)(1),
(2) Date: Sep. 22, 2017

(87) PCT Pub. No.: WO2016/152228
PCT Pub. Date: Sep. 29, 2016

(65) Prior Publication Data
US 2018/0062005 A1 Mar. 1, 2018

(30) Foreign Application Priority Data
Mar. 24, 2015 (JP) .................... 2015-061768

(51) Int. Cl.
*H01L 31/18* (2006.01)
*H01L 31/0236* (2006.01)
*H01L 31/0747* (2012.01)

(52) U.S. Cl.
CPC .... *H01L 31/02363* (2013.01); *H01L 31/0747* (2013.01); *H01L 31/1804* (2013.01); *Y02E 10/547* (2013.01); *Y02P 70/521* (2015.11)

(58) Field of Classification Search
CPC ........... H01L 31/02363; H01L 31/1804; H01L 31/0747; Y02E 10/50
See application file for complete search history.

(56) References Cited

U.S. PATENT DOCUMENTS 6,072,117 A * 6/2000 Matsuyama .... H01L 31/022466
136/256
6,207,890 B1 3/2001 Nakai et al.
(Continued)

FOREIGN PATENT DOCUMENTS

CN 102214726 A 10/2011
JP 2008-34583 A 2/2008
(Continued)

OTHER PUBLICATIONS

Machine Translation of IDS document JP2014-096459.*
(Continued)

*Primary Examiner* — William F Kraig
*Assistant Examiner* — Vicki B. Booker
(74) *Attorney, Agent, or Firm* — Hauptman Ham, LLP

(57) ABSTRACT

The method for manufacturing a crystalline silicon substrate for a solar cell includes: forming a texture on the surface of a single-crystalline silicon substrate by bringing an alkali solution and the surface of the single-crystalline silicon substrate into contact with each other; bringing an acidic solution and the surface of the single-crystalline silicon substrate into contact with each other to perform an acid treatment thereon; and then by bringing ozone water and the surface of the single-crystalline silicon substrate into contact with each other to perform an ozone treatment thereon. One (Continued)

aspect of embodiment is that the acidic solution used for the acid treatment is hydrochloric acid. Another aspect of embodiment is that the ozone treatment is performed by immersing the single-crystalline silicon substrate into the ozone water bath.

18 Claims, 4 Drawing Sheets

(56) References Cited

U.S. PATENT DOCUMENTS

| | | | |
|---|---|---|---|
| 2009/0280597 A1 | 11/2009 | Wijekoon et al. | |
| 2012/0097244 A1 | 4/2012 | Adachi et al. | |
| 2012/0288985 A1* | 11/2012 | Moriceau | H01L 21/30604 438/87 |
| 2013/0247974 A1 | 9/2013 | Moriyama et al. | |

FOREIGN PATENT DOCUMENTS

| | | |
|---|---|---|
| JP | 2011-515872 A | 5/2011 |
| JP | 2012-33856 A | 2/2012 |
| JP | 2013-131723 A | 7/2013 |
| JP | 2014-90087 A | 5/2014 |
| JP | 2014-96459 A | 5/2014 |
| JP | 2015-12171 A | 1/2015 |
| WO | 98/43304 A1 | 10/1998 |
| WO | 2009/120631 A2 | 10/2009 |
| WO | 2011/002086 A1 | 1/2011 |
| WO | 2012/036002 A1 | 3/2012 |

OTHER PUBLICATIONS

International Search Report dated Mar. 22, 2016 for PCT/JP2016/051852.

International Preliminary Report on Patentability with Written Opinion of the International Searching Authority dated Oct. 5, 2017 corresponding to International Application No. PCT/JP2016/051852.

* cited by examiner

US 10,333,012 B2

METHOD FOR MANUFACTURING CRYSTALLINE SILICON SUBSTRATE FOR SOLAR CELL, METHOD FOR MANUFACTURING CRYSTALLINE SILICON SOLAR CELL, AND METHOD FOR MANUFACTURING CRYSTALLINE SILICON SOLAR CELL MODULE

CROSS REFERENCE TO RELATED APPLICATION

This application claims the priority of Japanese Patent Application No. 2015-061768, filed on Mar. 24, 2015 in the Japanese Patent and Trademark Office. Further, this application is the National Phase application of International Application No. PCT/JP2016/051852 filed on Jan. 22, 2016, which is incorporated herein by reference in its entirety.

TECHNICAL FIELD

The invention relates to method for manufacturing crystalline silicon substrate for solar cell, a method for manufacturing crystalline silicon solar cell, and method for manufacturing crystalline silicon solar cell module.

BACKGROUND ART

A crystalline silicon-based solar cell using a crystalline silicon substrate has high photoelectric conversion efficiency, and is practically used as a photovoltaic power generation system. A heterojunction solar cell provided with a pn junction by depositing a non-single-crystalline silicon-based semiconductor thin-film of amorphous silicon or the like on a surface of a single-crystalline silicon substrate is excellent in conversion efficiency. In particular, a heterojunction solar cell including an intrinsic amorphous silicon thin-film between a single-crystalline silicon substrate and an amorphous silicon thin-film attracts attention as one of solar cells having the highest conversion efficiency.

In a crystalline silicon-based solar cell using a single-crystalline silicon substrate, such as a heterojunction solar cell, a surface of a silicon substrate is anisotropically etched to form a quadrangular pyramid-shaped (pyramidal) concave-convex structure so called texture, so that the surface reflectance is reduced and the optical path length of light incident to a crystalline silicon substrate is increased, and thereby increasing the photoelectric current to improve efficiency (so called optical confinement). The single-crystalline silicon substrate after formation of the texture is further subjected to other treatments for the purpose of, for example, adjusting the shape of the texture and cleaning the surface before formation of a semiconductor thin-film and a diffusion layer.

For example, Patent Document 1 discloses a method in which a texture is formed on a surface of a single-crystalline silicon substrate by anisotropic etching, and isotropic etching is then performed using an oxidizing aqueous solution such as $HF/HNO_3$, so that recesses of the texture are rounded. Patent Document 1 suggests that when recesses of the texture are rounded, an amorphous silicon thin-film formed on the texture has a uniform thickness, so that the open circuit voltage and the fill factor of a solar cell are improved.

Patent Document 2 discloses a method in which after formation of a texture as necessary, a treatment is performed to round recesses of the texture, and a single-crystalline silicon substrate is then immersed in ozone water to form an oxide film. When the silicon substrate after formation of the oxide film is immersed in an HF aqueous solution, metals and organic substances penetrating during formation of the texture by anisotropic etching are removed together with the oxide film, so that a surface of the silicon substrate is cleaned.

Patent Document 3 indicates that since a layer of a high-concentration silicon dissolution product (gel) is formed on a surface of a silicon substrate after anisotropic etching with an alkali, it may be difficult to clean the surface by an ozone treatment. Patent Document 3 suggests that ozone water is continuously supplied while the ozone concentration of the ozone water is made constant, thereby compensating for a reduction in efficiency due to autolysis of ozone to improve surface cleanliness by the ozone treatment. Patent Document 3 (see FIG. 12) describes a method in which the ozone concentration of the ozone water is made constant by supplying an ozone gas into an ozone water bath thereby improving treatment efficiency.

PRIOR ART DOCUMENTS

Patent Documents

Patent Document 1: JP A 10-545421
Patent Document 2: WO 2009/120631
Patent Document 3: JP A 2014-90087

SUMMARY OF THE INVENTION

Problems to be Solved by the Invention

Use of a crystalline silicon substrate in which recesses of texture are rounded by performing isotropic etching after anisotropic etching is effective for improvement of open circuit voltage and fill factor, but tends to reduce an anti-reflection effect due to rounded recesses, leading to a decrease in short circuit current of a solar cell. Particularly when the texture size is small, and the density of recesses on the substrate surface is high (the number of concave-convex structures is large), the effect of a decrease in short circuit current tends to be greater than the effect of improvement of fill factor and open circuit voltage due to rounded recesses, leading to a reduction in conversion efficiency of a solar cell.

Studies by the present inventors showed that when ozone cleaning was performed without performing isotropic etching after anisotropic etching, cleaning of the surface of the silicon substrate tended to be insufficient unless the ozone concentration was kept high by continuously supplying ozone water to overflow as described in Patent Document 3. However, it is difficult to say that the method including causing ozone water to overflow has high practicability because a large amount of waste ozone water is generated, leading to an increase in cost for waste liquid treatment and environmental load.

When ozone cleaning was performed while an ozone gas was bubbled into an ozone water bath without performing isotropic etching after anisotropic etching, the cleaning effect with ozone water was lower as compared to the method including causing ozone water to overflow, and metal ions and organic substances remained on a silicon substrate surface.

In view of these situations, an object of the present invention is to provide a single-crystalline silicon substrate for a solar cell in which recesses of texture are not rounded (i.e., the texture recess has small curvature radius), the single-crystalline silicon substrate having excellent optical confinement property and high cleanliness. Another object of the present invention is to provide a crystalline silicon-based solar cell and a crystalline silicon-based solar cell module including the above single-crystalline silicon substrate.

Means for Solving the Problems

The present inventors have found that when cleaning with hydrochloric acid is performed after formation of a texture by anisotropic etching and before ozone treatment, the effect of cleaning by ozone treatment is improved whereas the bottom of the texture is not rounded. The present invention relates to a method for manufacturing a crystalline silicon substrate for a solar cell. In the method, texture is formed on a surface of single-crystalline silicon substrate by anisotropic etching, and then a treatment of bringing hydrochloric acid and the texture-formed surface into contact with each other and a treatment of bringing ozone water and the surface into contact with each other are sequentially carried out.

Preferably, the ozone treatment is performed by immersing the single-crystalline silicon substrate in an ozone water bath. In one embodiment, an ozone gas is supplied to the ozone water bath to adjust the concentration of ozone water during ozone treatment.

The size of the texture on the surface of the single-crystalline silicon substrate after ozone treatment is preferably 0.1 μm or more and less than 5 μm. The curvature radius of the texture recess is preferably less than 5 nm.

The concentration of hydrochloric acid in acid treatment is preferably 1% by weight to 15% by weight. The temperature of hydrochloric acid is preferably 30° C. to 80° C.

In one embodiment of the present invention, the surface of the single-crystalline silicon substrate is treated with hydrofluoric acid after ozone treatment.

The present invention also relates to a method for manufacturing a crystalline silicon-based solar cell using the single-crystalline silicon substrate. In one embodiment, a conductive non-single-crystalline silicon-based thin-film is deposited on the texture-formed surface of the single-crystalline silicon substrate. Preferably, a transparent electroconductive layer is deposited on the conductive non-single-crystalline silicon-based thin-film.

Preferably, an intrinsic non-single-crystalline silicon thin-film is deposited before the conductive non-single-crystalline silicon-based thin-film is deposited on the single-crystalline silicon substrate. The crystalline silicon-based solar cell thus obtained includes an intrinsic non-single-crystalline silicon thin-film between a single-crystalline silicon substrate and a conductive non-single-crystalline silicon-based thin-film.

In one embodiment, a hydrogen plasma treatment is performed after at least a part of the intrinsic non-single-crystalline silicon thin-film is deposited and before the conductive non-single-crystalline silicon-based thin-film is deposited on single-crystalline silicon.

A plurality of crystalline silicon-based solar cells as described above are connected, and encapsulated by an encapsulant to obtain a solar cell module.

Effects of the Invention

According to the present invention, a texture-formed surface of a single-crystalline silicon substrate is subjected to an ozone treatment after being subjected to an acid treatment, and therefore the amount of impurities such as an alkali metal which are carried into ozone water decreases, so that efficiency of ozone treatment is improved. Thus, a crystalline silicon substrate for a solar cell which has excellent cleanliness is obtained. Since an acid treatment is performed using hydrochloric acid, the bottom of the texture is not excessively rounded. Thus, a solar cell including the single-crystalline silicon substrate obtained according to the present invention has an excellent optical confinement effect, and exhibits high conversion efficiency.

MODE FOR CARRYING OUT THE INVENTION

[Preparation of Textured Substrate]

Figure 1:
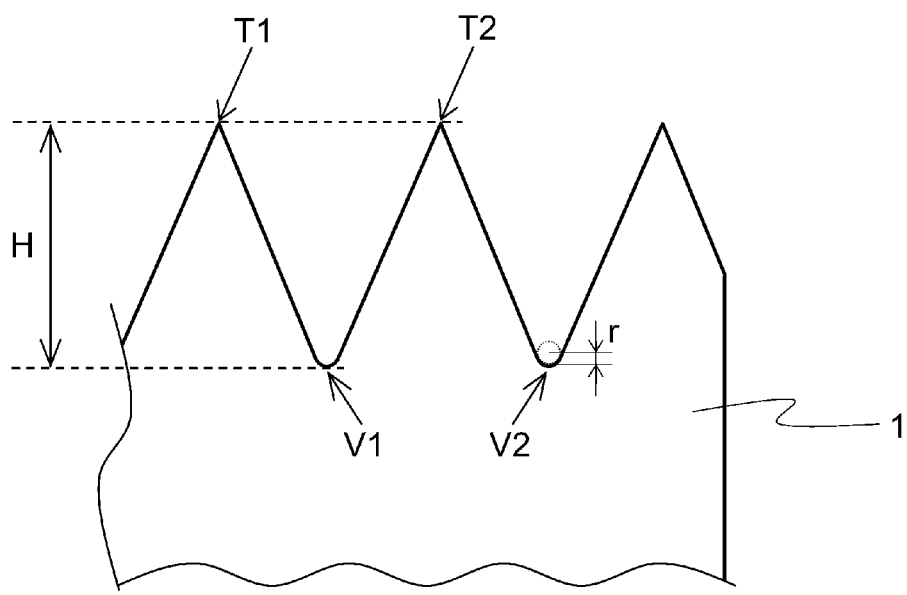
FIG. 1 is a schematic sectional view showing one example of a surface shape of a single-crystalline silicon substrate provided with a texture.

A crystalline silicon substrate for a solar cell according to the present invention is a single-crystalline silicon substrate of one-conductivity-type (p-type or n-type). The single-crystalline silicon substrate is prepared in the following manner: a silicon ingot prepared by, for example, a Czochralski method is sliced to a predetermined thickness using a wire-saw or the like. Preferably, the single-crystalline silicon substrate is cut out so as to have a (100) surface as a light-receiving surface for forming texture on a surface of the single-crystalline silicon substrate. This is because when the single-crystalline silicon substrate is etched, textured structure is easily formed by anisotropic etching which makes use of a difference between etching rates at (100) surface and at (111) surface.

The thickness of the single-crystalline silicon substrate is not particularly limited, and it is generally about 50 to 500 μm. The thickness D of the textured single-crystalline silicon substrate is calculated from a distance between a straight line connecting the peaks of projections in texture on one principal surface of the single-crystalline silicon substrate and a straight line connecting the peaks of projections in texture on the other principal surface (see FIG. 4). The thickness of the single-crystalline silicon substrate in the present invention is preferably 250 μm or less, more preferably 200 μm or less, further preferably 170 μm or less. When the thickness is decreased, a carrier recombination probability in the single-crystalline silicon substrate tends to be reduced, leading to improvement of the open circuit voltage and the fill factor of a solar cell.

(Pretreatment)

A silicon substrate sliced from an ingot (as-sliced substrate) is subjected to a pretreatment as necessary before texture formation by anisotropic etching. The pretreatment is performed for the purpose of, for example, removing deposits such as metals derived from a saw wire in slicing etc., and removing a slice damaged layer. For example, the pretreatment is performed by isotropically etching a surface of a single-crystalline silicon substrate 1 using an aqueous solution of an alkali such as sodium hydroxide or potassium hydroxide, a mixed liquid of hydrofluoric acid or nitric acid, or the like. Cleaning may be performed for the purpose of a cut powder in slicing, a polishing agent and so on.

(Anisotropic Etching)

An alkali solution (an anisotropic etchant) containing an additive for anisotropic etching is brought into contact with a surface of a single-crystalline silicon substrate to perform anisotropic etching, so that a texture is formed on the surface. As the anisotropic etchant, a commercially available anisotropic etchant may be used.

Examples of the alkali include sodium hydroxide and potassium hydroxide. In particular, potassium hydroxide is preferable. The anisotropic etchant may contain two or more alkalis. The pH of the anisotropic etchant is preferably 12 to 16, more preferably 13 to 15. When potassium hydroxide is used as the alkali, the concentration of potassium hydroxide is preferably 2 to 10% by weight, more preferably 2.5 to 8% by weight, further preferably 3 to 6% by weight.

The additive for anisotropic etching may have effect of reducing etching rate at (110) surface of crystalline silicon, so that the etching rate at (100) surface is relatively increased. As the additive for anisotropic etching, substances which serve to reduce the surface tension, e.g., lower alcohols such as isopropyl alcohol, and various kinds of surfactants, are preferably used. The anisotropic etchant may contain two or more additives for anisotropic etching. When isopropyl alcohol is used as the additive for anisotropic etching, the concentration of isopropyl alcohol is preferably 0.5 to 20% by weight, more preferably 0.8 to 18% by weight, further preferably 1 to 15% by weight.

Examples of the method for bringing an etchant into contact with a surface of a single-crystalline silicon substrate include an immersion of single-crystalline silicon substrate into an etchant, and an application of an etchant (e.g., an etchant is sprayed) onto single-crystalline silicon substrate surface. Among them, immersion of single-crystalline silicon substrate into an etchant is preferable. The immersion may be performed by immersing the substrate into an etching bath containing an etchant.

For appropriately adjusting etching rate, etching depth and so on, the anisotropic etching treatment temperature (temperature of the anisotropic etchant) is preferably 70 to 95° C., more preferably 80 to 90° C. The treatment time of anisotropic etching (immersion time in the anisotropic etchant) may be appropriately determined with consideration given to an alkali concentration, a temperature and so on, and for example, it is preferably about 10 to 30 minutes.

The size of the texture formed on a surface of the single-crystalline silicon substrate tends to increase as etching proceeds. For example, the texture size can be adjusted by changing the type of the additive for anisotropic etching. When the etching time is increased, the alkali concentration is increased, or the treatment temperature is increased, the texture size tends to increase.

(Acid Treatment)

An acid treatment is performed by bringing an acidic solution into contact with the surface of the single-crystalline silicon substrate on which texture is formed by anisotropic etching. A high-concentration silicon dissolution product (water glass) is deposited on the surface of the single-crystalline silicon substrate immediately after anisotropic etching is performed with an alkali solution. The dissolution product forms a high-viscosity gel layer, and cannot be easily removed even when cleaned with water. The gel layer contains a metal deposited on a surface on the silicon substrate during slicing, a metal in the silicon substrate, which is dissolved during etching, an alkali metal (potassium or the like) in anisotropic etching, an additive (organic substance), and so on.

By performing the acid treatment, the alkaline surface of the silicon substrate can be neutralized to dissolve and remove gelled water glass. Thus, in the subsequent ozone treatment, the amount of impurities such as a metal and an organic substance which are brought into ozone water can be reduced, so that ozone treatment efficiency is improved. Ozone tends to be easily autolyzed by reacting with hydroxide ions ($OH^-$), and therefore when the substrate surface is neutralized by the preceding acid treatment to decrease $OH^-$ concentration, a decrease in ozone concentration in ozone cleaning can be suppressed, so that ozone treatment efficiency can be improved, and at the same time, the thickness of the oxide film can be made uniform.

Inorganic acids such as sulfuric acid ($H_2SO_4$) and nitric acid ($HNO_3$) have high oxidizing property. When such an oxidizing acid and a texture-formed surface of the silicon substrate are brought into contact with each other, isotropic etching tends to proceed to round recesses (increase the curvature radius of the recess) of the texture. Hydrochloric acid is an acid having lower oxidizing property as compared to sulfuric acid, nitric acid and the like. Thus, when the acid treatment is performed with hydrochloric acid, isotropic etching of the single-crystalline silicon substrate hardly proceeds.

The acid treatment is performed using hydrochloric acid as an acidic solution after anisotropic etching with an alkali, and therefore without rounding recesses of the texture, the surface of the silicon substrate can be neutralized to remove water glass, leading to improvement of cleanliness. Accordingly, a single-crystalline silicon substrate having high cleanliness and an excellent anti-reflection effect is obtained. Particularly, when the texture size is small, and the number density of recesses in pyramidal concave-convex structures is large, the anti-reflection effect tends to be remarkably improved, leading to an increase in short circuit current density of a solar cell. Chlorine atoms (chloride ions) in hydrochloric acid (hydrogen chloride) less strongly act as a carrier recombination center impurity as compared to sulfur atoms in sulfuric acid and nitrogen atoms in nitric acid. Thus, acid cleaning with hydrochloric acid is preferable for improving the open circuit voltage and the fill factor by cleaning the silicon substrate.

The acidic solution to be used for acid treatment may contain an acid other than hydrogen chloride for the purpose of, for example, adjusting the pH. An inorganic acid other than hydrogen chloride has high oxidizing property, and has the effect of isotropically etching the silicon substrate, and an organic acid tends to act as a carrier recombination impurity when captured in the silicon substrate. Thus, the concentration of an acid other than hydrogen chloride in the acidic solution is preferably 1% by weight or less, more preferably 0.5% by weight or less, further preferably 0.1% by weight or less, especially preferably 0.05% by weight or less.

The acidic solution may contain an additive such as a surfactant for the purpose of, for example, improving cleaning efficiency. An additive such as an organic substance or a metal salt tends to act as a carrier recombination impurity when captured in the silicon substrate as an impurity, and an organic acid tends to act as a carrier recombination impurity when captured in the silicon substrate. Thus, the content of the additive in the acidic solution is preferably 1% by weight or less, more preferably 0.5% by weight or less, further preferably 0.1% by weight or less, especially preferably 0.05% by weight or less. The acidic solution to be used for acid cleaning is preferably a solution of hydrochloric acid (HCl aqueous solution) which does not contain acids and additives other than industrially produced hydrochloric acid and inevitable impurities contained in water used for dilution of the hydrochloric acid.

For improving removability of a silicon dissolution product on the silicon substrate surface, the concentration of hydrochloric acid (HCl concentration) in the acidic solution to be used for acid treatment is preferably 1% by weight or more. For suppressing etching of the silicon substrate and suppressing deterioration of a work environment, the concentration of hydrochloric acid is preferably 15% by weight or less. The concentration of hydrochloric acid is more preferably 2 to 12% by weight, further preferably 3 to 10% by weight.

The method for bringing an acidic solution (hydrochloric acid) into contact with a surface of the single-crystalline silicon substrate is preferably an immersion of the single-crystalline silicon substrate into an acidic solution. The immersion is performed by immersing the substrate into an acidic bath containing an acidic solution.

The acid treatment temperature (temperature of the acidic aqueous solution) is preferably 30 to 80° C., more preferably 35 to 75° C., further preferably 40 to 70° C., for improving removability of a silicon dissolution product and suppressing volatilization of hydrochloric acid to prevent the work environment deterioration and to prevent hydrochloric acid concentration reduction. By increasing the acid treatment temperature, acid cleaning efficiency tends to be improved, leading to improvement of conversion efficiency of a solar cell. Particularly, in production of a heterojunction solar cell including an intrinsic silicon thin-film on a single-crystalline silicon substrate, conversion efficiency tends to be improved by increasing the acid cleaning temperature for the silicon substrate. In particular, when a hydrogen plasma treatment is performed after deposition of at least a part of a silicon thin-film in production of a heterojunction solar cell, the conversion characteristic tends to be remarkably improved by the hydrogen plasma treatment when the acid cleaning temperature for the silicon substrate is increased. The acid treatment time (immersion time in the acidic aqueous solution) may be appropriately determined with consideration given to a hydrochloric acid concentration, a temperature and so on, and for example, it is preferably about 5 to 20 minutes.

(Ozone Treatment)

After the acid treatment with hydrochloric acid, ozone water and the surface of the single-crystalline silicon substrate are brought into contact with each other to perform an ozone treatment. By performing the ozone treatment, silicon on the substrate surface is oxidized, so that an oxide film having a thickness of about 0.2 to 5 nm is formed, and impurities etc. deposited on the surface of the substrate are captured in the oxide film. After the ozone treatment, the oxide film is removed by, for example, etching with hydrofluoric acid to clean the surface of the silicon substrate.

The method for bringing an ozone water and a surface of the single-crystalline silicon substrate brought into contact with each other is preferably an immersion of the single-crystalline silicon substrate into ozone water. The immersion may be performed by immersing the substrate in an ozone water bath containing an ozone water.

For improving oxide film formation efficiency by the ozone treatment, the ozone concentration of ozone water is preferably 5 ppm or more, more preferably 10 ppm or more, further preferably 15 ppm or more. Since ozone has low solubility in water, and is easily autolyzed in water, the ozone concentration of ozone water tends to decrease in a short time. Preferably, the ozone treatment is performed while ozone is supplied to the ozone water bath for keeping the ozone concentration of ozone water in the above-mentioned range. Examples of the method for supplying ozone to the ozone water bath include supplying high-concentration ozone water to the ozone water bath, and bubbling ozone gas into the ozone water bath.

The ozone treatment temperature (temperature of ozone water in the ozone water bath) is not particularly limited, and for example, it is preferably about 15 to 40° C., more preferably 20 to 30° C. The ozone treatment time (immersion time of the substrate in ozone water) may be appropriately determined with consideration given to an ozone concentration, a treatment temperature and so on, and for example, it is preferably about 5 to 30 minutes.

Figure 2:
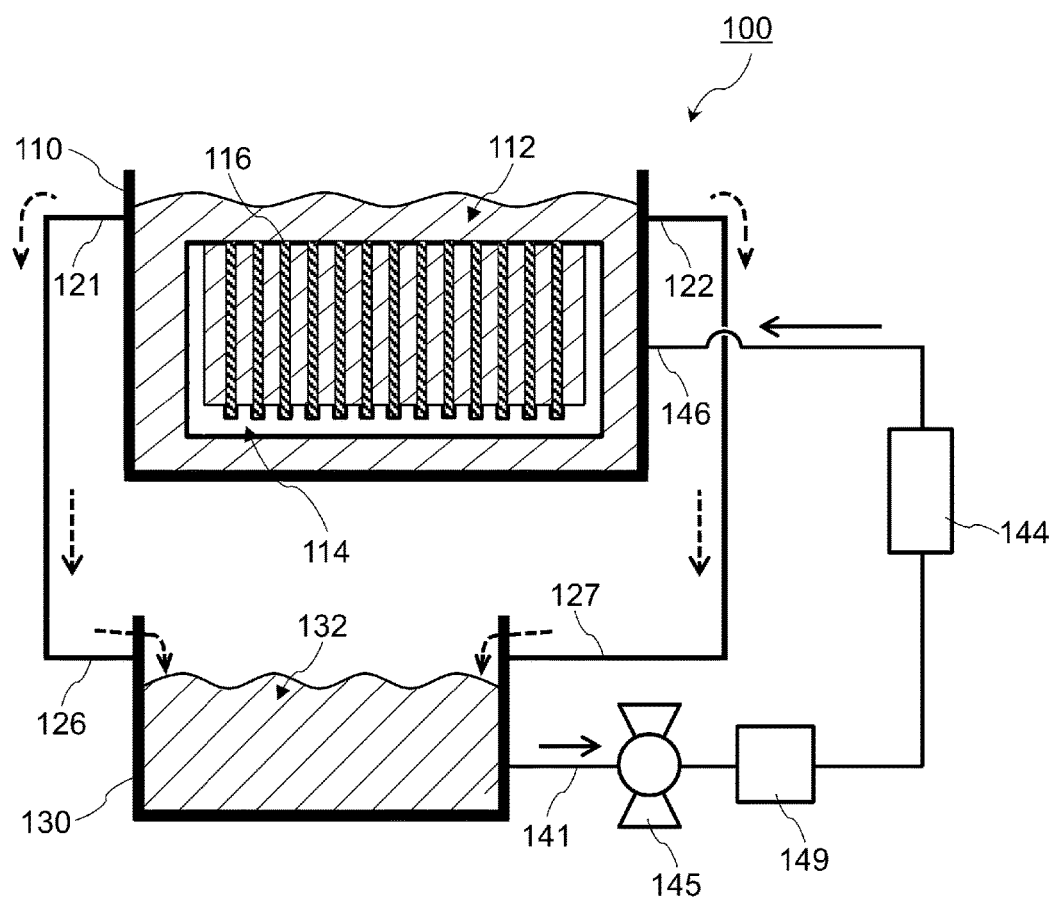
FIG. 2 is a conceptual view showing one embodiment of an ozone treatment apparatus.

FIG. 2 is a conceptual view showing one embodiment of an ozone treatment apparatus for performing an ozone treatment of a silicon substrate. An ozone treatment apparatus 100 includes an ozone water bath 110, and ozone water 112 is contained in the ozone water bath 110. A cassette 114 with a plurality of silicon substrates 116 set therein is immersed in ozone water 112 to perform an ozone treatment. An ozone water supply pipe 146 is connected to the ozone water bath 110, and high-concentration ozone water is supplied to the ozone water bath 110 from an ozone water generator 144. Discharge pipes 121 and 122 for causing ozone water 112 to overflow are connected to the upper part of the ozone water bath 110. Thus, by supplying and discharging ozone water, the ozone concentration of ozone water 112 can be kept high.

Ozone water discharged from the discharge pipes may be treated as waste ozone water. For reducing the amount of waste ozone water, it is preferable that the ozone is reused after the ozone concentration is increased. For example, ozone water discharged from the discharge pipes 121 and 122 is supplied to the ozone generator 144 to increase the ozone concentration, and then supplied from the ozone water supply pipe 146 to the ozone water bath 110, whereby ozone water can be reused. In the apparatus 100 shown in FIG. 2, ozone drainage water discharged from the ozone water bath 110 is supplied to a drainage water tank 130 from drainage water supply pipes 126 and 127. Ozone drainage water 132 in the drainage water tank 130 is supplied to the ozone water generator 144 through a pump 145 to increase the ozone concentration, and then supplied to the ozone water bath 110 from the ozone water supply pipe 146.

As described above, the silicon substrate 116 is subjected to an acid treatment with hydrochloric acid to remove water glass on a surface of the substrate after anisotropic etching with an alkali. Thus, even after the silicon substrate is immersed to start the ozone treatment, an increase in concentration of impurities such as silicon oxide, metal ions and an organic substance in ozone water 112 in the ozone water bath 110 can be suppressed. Since ozone drainage water 132 has a low impurity concentration, the impurity concentration of ozone water 112 can be kept low even when ozone water is reused, so that efficiency of ozone treatment can be improved, and impurities in ozone water are inhibited from being captured in the oxide film, so that a high cleaning effect can be maintained.

For resupply to the ozone water bath 110, the treatment for increasing the ozone concentration of ozone drainage water 132 may be performed in the ozone drainage water tank 130. For example, by bubbling an ozone gas into the drainage water tank 130, the ozone concentration can be increased. Before being resupplied to the ozone water bath 110, ozone drainage water 132 in the drainage water tank 130 may be subjected to a treatment different from the treatment for increasing the ozone concentration. For example, by performing a treatment such as deionization or filtration in an impurity removing unit 149, the impurity concentration in ozone water can be reduced. In the present invention, since the silicon substrate 116 freed of water glass etc. on a surface by the acid treatment is subjected to an ozone treatment, ozone drainage water has a low concentration of impurities such as silicon oxide, and impurities can be easily removed by deionization, filtration or the like.

Various kinds of controls may be performed for adjusting the ozone concentration of ozone water 112 in the ozone water bath 110. For example, each of the ozone water bath 110, discharge pipes 121 and 122 (or drainage water supply pipes 126 and 127), the drainage water tank 130 and so on is provided with an ozone concentration detector (not illustrated) to monitor the ozone concentration. On the basis of the detected ozone concentration, the preparation amount of ozone water or the ozone concentration in the ozone water generator 144, the supply amount (circulation rate) of ozone water by the pump 145, or the like is adjusted by PID control etc., whereby the ozone concentration of ozone water 112 can be kept within a fixed range.

Figure 3:
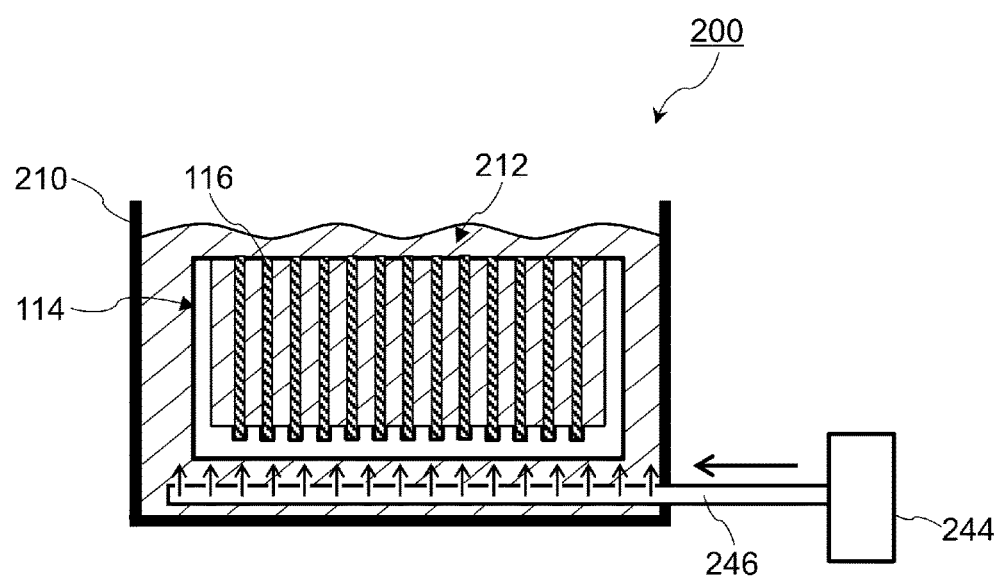
FIG. 3 is a conceptual view showing one embodiment of an ozone treatment apparatus.

FIG. 3 is a conceptual view showing another embodiment of an ozone treatment apparatus for performing an ozone treatment of a silicon substrate. In this embodiment, the ozone concentration of ozone water is increased by supplying and bubbling an ozone gas into the ozone water bath instead of supplying ozone water to the ozone water bath.

An ozone treatment apparatus 200 includes an ozone water bath 210, and the ozone water bath 210 contains ozone water 212. A cassette 114 with a plurality of silicon substrates 116 set therein is immersed in ozone water 212 to perform an ozone treatment. An ozone gas supply pipe 246 is installed in the ozone water bath 210. An ozone gas generated in an ozone gas generator 244 is bubbled into the ozone water bath 210 through an ozone gas supply pipe 246, whereby the ozone concentration of ozone water 212 can be increased.

In this embodiment, various kinds of controls may be performed for adjusting the ozone concentration of ozone water 212 in the ozone water bath 210. For example, the ozone water bath 110 is provided with an ozone concentration detector (not illustrated) to monitor the ozone concentration, and on the basis of the detected ozone concentration, the amount of an ozone gas generated in the ozone gas generator 244 is adjusted by PID control etc., whereby the ozone concentration of ozone water 212 can be kept within a fixed range.

In the method including bubbling an ozone gas into the ozone water bath 210, ozone is supplied in a gaseous state to the ozone water bath, and therefore autolysis of ozone before supply of ozone to the water bath can be more reliably suppressed as compared to the method including supplying ozone water. Ozone water 212 can be kept saturated with ozone, and therefore ozone treatment efficiency is improved. The method including bubbling an ozone gas can contribute to simplification of a process and cost reduction because the ozone treatment apparatus 200 has a simpler configuration as compared to a case where ozone water is circulated and reused.

In the method according to the present invention, the silicon substrate is subjected to an acid treatment with hydrochloric acid to remove water glass on a surface of the substrate after anisotropic etching with an alkali and before the ozone treatment. Therefore an increase in impurity concentration of ozone water 212 in the ozone water bath 210 can be suppressed even when an ozone gas is bubbled without replacing ozone water by overflow of the ozone water. Accordingly, efficiency of ozone treatment can be improved, and impurities in ozone water are inhibited from being captured in the oxide film, so that a high cleaning effect can be maintained.

FIGS. 2 and 3 show a batch-type treatment mode in which a cassette with silicon substrates set therein is immersed in ozone water, but an ozone treatment may be performed while silicon substrates are continuously conveyed by a horizontal conveyance method or the like.

(Removal of Oxide Film)

Preferably, an oxide film formed on a surface of the silicon substrate is removed after the ozone treatment. When the oxide film is removed, impurities on the silicon substrate surface can be removed together with the oxide film, so that cleanliness of the silicon substrate surface is improved. Preferably, removal of the oxide film is performed by bringing an acid into contact with a surface of the single-crystalline silicon substrate after the ozone treatment. In particular, hydrofluoric acid is preferably used as the acid for removing the oxide film.

The method for bringing an acid into contact with a surface of the single-crystalline silicon substrate is preferably an immersion of the single-crystalline silicon substrate into a water bath containing an acid such as hydrofluoric acid. When the oxide film is removed by immersion of the substrate in hydrofluoric acid, the concentration of hydrofluoric acid is preferably 1 to 10% by weight, more preferably 1.5 to 5% by weight, further preferably 2 to 5% by weight for reliably removing the oxide film and suppressing excessive etching. The treatment temperature is not particularly limited, and for example, it is about 20 to 30° C. The treatment time may be appropriately determined with consideration given to a thickness of the oxide film, an acid concentration, a temperature and so on, and for example, the treatment time is set to 1 to 10 minutes.

When the acid concentration is high or the treatment time is long in the hydrofluoric acid treatment, the surface of the single-crystalline silicon substrate after removal of the oxide film may be etched because etching proceeds even after removal of the oxide film. Etching of the single-crystalline silicon substrate with hydrofluoric acid is isotropic, and therefore when etching of the substrate proceeds, recesses of the texture tend to be rounded, leading to a decrease in short circuit current density of a solar cell. Thus, in the treatment with hydrofluoric acid, the oxide film formed by the ozone treatment is reliably removed, and treatment conditions are preferably set according to a thickness of the oxide film, etc. so that etching of the single-crystalline silicon substrate does not excessively proceed.

In the present invention, the thickness of the oxide film can be controlled because an ozone treatment with ozone water can be performed while the ozone concentration is controlled. Since the thickness of the oxide film can be controlled to fall within a predetermined range, it is able to easily set hydrofluoric acid treatment conditions which ensure that the oxide film is reliably removed, and isotropic etching of the single-crystalline silicon substrate does not excessively proceed. Thus, a single-crystalline silicon substrate which has high cleanliness and which is inhibited from being isotropically etched at recesses of the texture is obtained.

(Rinsing of Substrate)

In the present invention, a treatment other than the above-mentioned anisotropic etching, acid treatment, ozone treatment and removal of the oxide film may be performed. For example, the single-crystalline silicon substrate taken out from a liquid such as an etchant, hydrochloric acid, ozone water or hydrofluoric acid may be rinsed with pure water or the like before being immersed in other liquid. By rinsing a surface of the silicon substrate, the amount of the liquid brought to other step can be reduced to improve efficiency of the treatment, and the frequency of liquid replacement can be reduced to improve efficiency in each step.

[Shape of Texture on Single-Crystalline Silicon Substrate]

FIG. 1 is a schematic sectional view showing one example of a surface shape of the single-crystalline silicon substrate 1 provided with texture. Preferably, the texture is continuously formed. The term "continuously" means a state in which projections of the texture are adjacent to one another with the structure having substantially no flat section. When the texture has a continuous shape, a high anti-reflection effect is attained, so that the short circuit current density of a solar cell is improved.

The range of the texture size is not particularly limited, and the texture size is generally about 1 to 10 μm. When an intrinsic silicon-based thin-film is deposited on a surface of the single-crystalline silicon substrate to prepare a heterojunction solar cell, the texture size is preferably less than 5 μm, more preferably 4 μm or less, further preferably 3.5 μm or less. When the texture size is less than 5 μm, a difference between the thicknesses of the intrinsic silicon-based thin-film on texture projections and on texture recesses is small, and thus a solar cell having a high open circuit voltage and fill factor is obtained. The texture size is preferably 0.1 μm or more, more preferably 1 μm or more, further preferably 1.5 μm or more for obtaining a sufficient optical confinement effect.

The size of the texture on the surface of the single-crystalline silicon substrate is determined from a height difference between the peak of the projection and the valley of the recess. The height difference H is defined by a distance between a line connecting peaks T1 and T2 of projections of adjacent concave-convex structures, respectively and a valley V1 of a recess between both the peaks.

The size of the texture can be determined by measuring the surface shape of the substrate using an atomic force microscope. Specifically, the height difference H is determined by scanning the surface of the single-crystalline silicon substrate over a range of about 40×40 μm$^2$ with the atomic force microscope (AFM) to measure the surface shape. The height difference H may be calculated from a distance between a straight line T1–T2 and V1 where T1 is a peak of a texture projection, which is randomly selected from the measured surface shape (AFM image), T2 is a peak of a projection of one texture adjacent to the peak T1, and V1 is a valley of a recess between the peaks T1 and T2. When there is an in-plane texture size variation, height differences at 20 spots are calculated, and the average thereof is determined, and defined as the size H of the texture.

The curvature radius of the texture recess of the single-crystalline silicon substrate after the ozone treatment is preferably less than 5 nm. The curvature radius of the texture recess is more preferably less than 3 nm, further preferably less than 2.5 nm. The lower limit of the curvature radius of the texture recess is not limited, and the curvature radius of the recess is generally 0.1 nm or more even when a treatment for rounding recesses by isotropic etching is not performed. When the oxide film is removed by hydrofluoric acid or the like after the ozone treatment, the curvature radius of the texture recess of the single-crystalline silicon substrate after removal of the oxide film is preferably within the above-mentioned range.

The curvature radius of the texture recess can be determined by observing a cross-section shape of the substrate using a transmission electron microscope (TEM). From an observation image (TEM image) of the texture recess, the shape of an area in the vicinity of the recess is approximated with an arc of an imaginary circle. The radius of the imaginary circle here is defined as a curvature radius r (see FIG. 1). The imaginary circle can be determined by the following method: a boundary is defined by subjecting an observation image of a cross-section to a binarization; and central coordinates and a radius are calculated by a least squares method on the basis of the coordinates of the boundary in the vicinity of a recess V2. When there is a distribution in the curvature radii of texture recesses, curvature radii at 20 spots are calculated, and the average thereof is determined, and defined as the curvature radius of the texture recess.

As described above, the texture size can be adjusted by adjusting anisotropic etching conditions (type of the additive, concentration of the alkali, temperature, time and so on). The curvature radius of the texture recess can be adjusted by, for example, whether isotropic etching is performed or not. When an isotropic etching is performed after formation of the texture, the curvature radius tends to increase. In the present invention, hydrochloric acid is used in the acid treatment after anisotropic etching, and therefore isotropic etching hardly proceeds, so that the curvature radius of the texture recess can be reduced.

When isotropic etching of the substrate proceeds, the curvature radius of the recess increases. Since the thickness of the oxide film formed by the ozone treatment is about 0.2 to 5 nm (normally about 1 to 2 nm), the texture recess is not excessively rounded even when the oxide film is removed by etching using hydrofluoric acid or the like. In the present invention, an ozone treatment with ozone water is performed while the ozone concentration is adjusted, so that the thickness of the ozone oxide film can be controlled, and therefore it is easy to set hydrofluoric acid treatment conditions which ensure that isotropic etching of the single-crystalline silicon substrate does not excessively proceed. Thus, isotropic etching of texture recesses by hydrofluoric acid or the like is suppressed, so that the texture recesses can be prevented from being excessively rounded to ensure that the curvature radius of the recess is less than 5 nm even after removal of the oxide film.

Since the ozone water treatment is performed after the acid treatment with hydrochloric acid, the single-crystalline silicon substrate obtained by the method according to the present invention has high cleanliness. Further, the texture size is small, and thus during preparation of a solar cell, an intrinsic silicon-based thin-film deposited on the texture has a uniform thickness, so that a high passivation effect is obtained. Moreover, isotropic etching is suppressed, so that texture recess has a small curvature radius (recesses are not excessively rounded), and therefore a solar cell having a high optical confinement effect and a high short circuit current density can be prepared.

[Solar Cell]

The silicon substrate prepared by the above-mentioned method is used for manufacturing a crystalline silicon-based solar cell. The crystalline silicon-based solar cell can be prepared by, for example, forming an n-layer as a diffusion layer on one principal surface of a p-type crystalline silicon substrate, and forming a p$^+$ layer on the other principal surface. A heterojunction-type crystalline silicon-based solar cell can be prepared by depositing a non-single-crystalline silicon semiconductor thin-film on a surface of a silicon substrate.

In particular, a heterojunction solar cell which includes a conductive non-single-crystalline silicon-based thin-film on a texture-formed surface of a single-crystalline silicon substrate prepared by the method according to the present invention and which includes an intrinsic non-single-crystalline silicon-based thin-film between the single-crystalline silicon substrate and the conductive non-single-crystalline silicon-based thin-film can attain high conversion efficiency. Examples of the material of the non-single-crystalline silicon-based thin-film include amorphous silicon and microcrystalline silicon.

The silicon substrate obtained according to the present invention has high cleanliness of the surface and reduced defects. Therefore, when the silicon substrate is used in a heterojunction solar cell, the characteristics of the interface between the silicon substrate and a silicon-based thin-film are improved, so that a passivation effect etc. by an intrinsic silicon-based thin-film can be improved. Thus, a heterojunction solar cell having a high open circuit voltage and fill factor is obtained.

Figure 4:
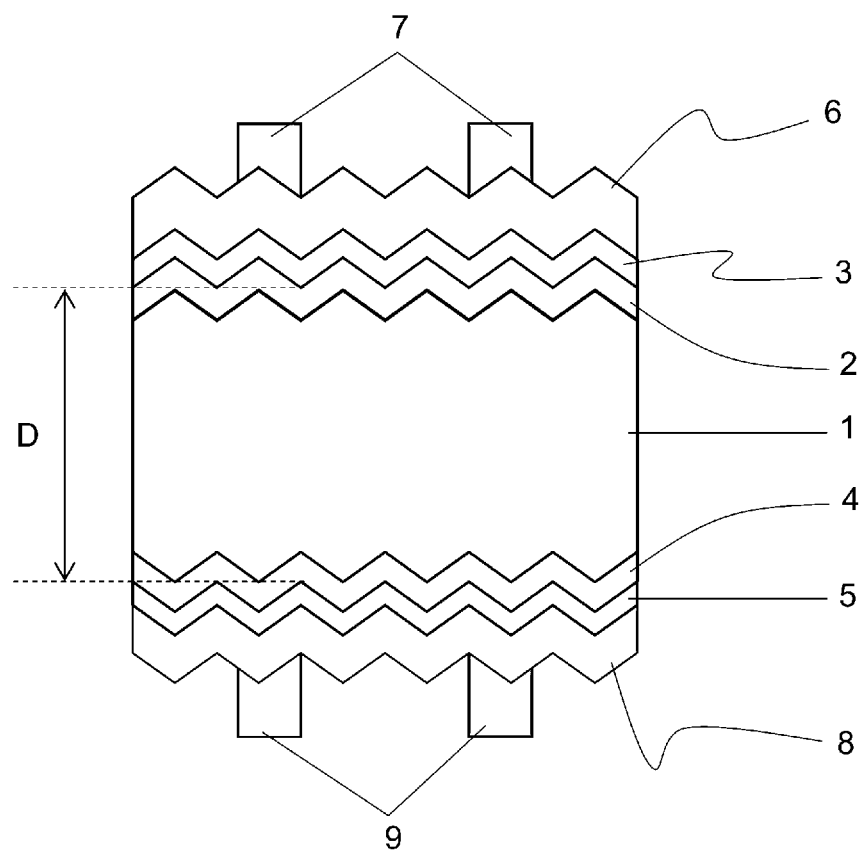
FIG. 4 is a schematic sectional view showing a crystalline silicon-based solar cell according to one embodiment.

FIG. 4 is a schematic sectional view showing one example of a heterojunction solar cell. The heterojunction solar cell shown in FIG. 4 includes a first intrinsic silicon-based thin-film 2 on one surface of an n-type single-crystalline silicon substrate 1, and a second intrinsic silicon-based thin-film 4 on the other surface. A p-type silicon-based thin-film 3 and an n-type silicon-based thin-film 5 are formed on the first intrinsic silicon-based thin-film 2 and the second intrinsic silicon-based thin-film 4, respectively. A p-type single-crystalline silicon substrate may be used in place of the n-type single-crystalline silicon substrate 1.

The intrinsic silicon-based thin-films 2 and 4 are non-doped substantially intrinsic silicon-based thin-films, and are preferably non-doped hydrogenated amorphous silicon consisting essentially of silicon and hydrogen. When intrinsic silicon-based thin-films 2 and 4 are formed on each surface of the single-crystalline silicon substrate 1, surface passivation can be effectively performed while suppressing diffusion of impurities to the single-crystalline silicon substrate 1 during deposition of the conductive silicon thin-films 3 and 5.

The thickness of the intrinsic silicon-based thin-films 2 and 4 is preferably in a range of 3 to 16 nm, more preferably in a range of 4 to 14 nm, further preferably in a range of 5 to 12 nm. The intrinsic silicon-based thin-film with the above thickness range may provide appropriate coverage to the surface of the single-crystalline silicon substrate, so that diffusion of impurities from the conductive silicon-based thin-films 3, 5 into the single-crystal silicon substrate may be suppressed, while electrical loss due to series resistance and optical loss due to light absorption may be reduced at the same time.

A plasma-enhanced CVD method is preferable for deposition of the silicon-based thin-films. A raw material gas used for deposition of the silicon-based layers by plasma-enhanced CVD may be a silicon-containing gas such as $SiH_4$ or $Si_2H_6$, or a mixed gas of silicon-based gas and $H_2$. A gas containing a different element, such as $CH_4$, $CO_2$, $NH_3$ or $GeH_4$, may be added to the aforementioned gas to deposit a silicon alloy layer, such as silicon carbide, silicon nitride and silicon germanium. A dopant gas used for deposition of the conductive (p-type or n-type) silicon-based thin-films is preferably, for example, $B_2H_6$ or $PH_3$. The amount of impurity such as P or B added is sufficient to be a trace amount; thus, a mixed gas wherein a dopant gas is beforehand diluted with the raw material gas, $H_2$ or the like may be used. Deposition conditions for forming the silicon-based thin-films by a plasma-enhanced CVD method are preferably, for example, as follows: a substrate temperature of 100 to 300° C.; a pressure of 20 to 2600 Pa; and a high-frequency power density of 0.003 to 0.5 W/cm$^2$.

In one embodiment, the intrinsic silicon-based thin films 2 and 4 are subjected to a plasma treatment (hydrogen plasma treatment) in an atmosphere of a gas containing hydrogen as a main component. Specifically, mention is made of, for example, a method in which a hydrogen plasma treatment is performed after deposition of the intrinsic silicon-based thin-films 2 and 4 and before deposition of the conductive silicon-based thin-films 3 and 5; and a method in which deposition of the intrinsic silicon-based thin-films 2 and 4 is temporarily stopped along the way, a hydrogen plasma treatment is then performed, and deposition of the intrinsic silicon-based thin-films is then resumed (a hydrogen plasma treatment may be further performed before deposition of the conductive silicon-based thin-films). In particular, it is preferable that deposition of the intrinsic silicon-based thin-film is temporarily stopped along the way to perform a hydrogen plasma treatment, and then the deposition is resumed. In this case, the total thickness of the intrinsic silicon-based thin-films deposited before the hydrogen plasma treatment and after the hydrogen plasma treatment is preferably within the abovementioned thickness range. For example, it is preferable that a film having a thickness of 40 to 60% of the total thickness is deposited, a hydrogen plasma treatment is then performed, and the deposition is thereafter resumed to attain the total thickness.

By subjecting the intrinsic silicon-based thin-films 2 and 4 to a hydrogen plasma treatment, epitaxial growth of the intrinsic silicon-based thin-films is suppressed, so that an amorphous state can be maintained, and therefore a high passivation effect can be maintained. By performing a hydrogen plasma treatment after depositing the intrinsic silicon-based thin-film in a part of the total thickness, a passivation effect by the hydrogen plasma can be exerted on a surface of the single-crystalline silicon substrate 1 and an interface between the single-crystalline silicon substrate 1 and each of the intrinsic silicon-based thin-films 2 and 4 while plasma damage to the single-crystalline silicon substrate 1 is reduced.

As conditions for the hydrogen plasma treatment, for example, the substrate temperature and the pressure are preferably 100 to 300° C. and 20 to 2600 Pa, respectively. The high-frequency power density in the hydrogen plasma treatment step and the hydrogen plasma treatment time can be appropriately set within a range which ensures that the aforementioned effect is obtainable. The "atmosphere of a gas containing hydrogen as a main component" in the hydrogen plasma treatment step has hydrogen concentration of 70% by volume, and may contain an inert gas such as nitrogen, helium or argon. It is preferred that a raw material gas such as $SiH_4$ is not introduced in the chamber and raw material gas used in deposition of the intrinsic silicon-based thin-film does not remain in the chamber during the hydrogen plasma treatment. It is preferred that silicon-based thin-film is not substantially deposited during plasma discharge, even if the raw material gas is contained in the gas atmosphere during the hydrogen plasma treatment. The acceptable limit of the content of the raw material gas during the hydrogen plasma treatment depends on other deposition parameters, but is preferably 1/100 or less, more preferably 1/500 or less, further preferably 1/2000 or less of the content of hydrogen on a volume basis.

The intrinsic silicon-based thin-film is amorphous silicon as described previously but a part of the intrinsic silicon-based layer may be crystallized by the hydrogen plasma treatment. Deposition of the intrinsic silicon-based thin-film and the hydrogen plasma treatment are preferably carried out successively in the same deposition chamber. Plasma discharge is preferably stopped temporarily after deposition of the intrinsic silicon-based thin-film and before starting the hydrogen plasma treatment. Specifically, it is preferable that supply of a raw material gas is stopped after the plasma discharge is stopped so that the inside of the chamber is adjusted to an atmosphere under a gas containing hydrogen as a main component, and thereafter the discharge is resumed to start the hydrogen plasma treatment. With this method, deposition of an intrinsic silicon-based thin-film during the hydrogen plasma treatment can be suppressed.

One or both of the first intrinsic silicon-based thin-film 2 and the second intrinsic silicon-based thin-film 4 may be subjected to the hydrogen plasma treatment. When both of the first intrinsic silicon-based thin-film 2 and the second intrinsic silicon-based thin-film 4 are subjected to the hydrogen plasma treatment, further improvement of conversion efficiency can be expected.

In production of a solar cell using the crystalline silicon substrate according to the present invention, the effect of improving conversion characteristics (mainly open circuit voltage and fill factor) by subjecting the intrinsic silicon-based thin-film to the hydrogen plasma treatment. This may be because the surface of the silicon substrate is clean, so that a passivation effect is easily exerted on the interface by hydrogen plasma. Reduction of open circuit voltage and fill factor (characteristics which are deteriorated due to unevenness of the thickness of the intrinsic silicon-based thin-film, defects at recesses of the texture, and so on) due to small curvature radius of the texture recess (recesses are not rounded) is compensated by the hydrogen plasma treatment. This is also considered to contribute to improve conversion characteristics.

The p-type silicon-based thin-film 3 is deposited on the first intrinsic silicon-based thin-film 2. The n-type silicon-based thin-film 5 is deposited on the second intrinsic silicon-based thin-film 4. These conductive silicon-based thin-films are non-single-crystalline silicon-based thin-films, and examples of the material thereof include amorphous silicon-based materials such as amorphous silicon, amorphous silicon carbide, amorphous silicon oxide and amorphous silicon nitride, and microcrystalline silicon-based materials such as microcrystalline silicon, microcrystalline silicon carbide, microcrystalline silicon oxide and microcrystalline silicon nitride. The thickness of each of conductive silicon-based thin-films 3 and 5 is preferably 3 to 50 nm, more preferably 5 to 30 nm.

The first transparent electroconductive layer 6 and the second transparent electroconductive layer 8 are formed on conductive silicon-based thin-films 3 and 5, respectively. The thickness of each of transparent electroconductive layers 6 and 8 is preferably 10 to 140 nm for attaining both transparency and electroconductivity. As the material for the transparent electroconductive layer, transparent conductive metal oxide, for example, indium oxide, tin oxide, zinc oxide, titanium oxide or a complex oxide thereof is preferably used. Particularly, an indium-based complex oxide having indium oxide as a main component is preferable, and indium tin oxide (ITO) is particularly suitable, for attaining both high electroconductivity and high transparency. Examples of the deposition method for the transparent electrode layer include a sputtering method, an ion plating method, a metal organic chemical vapor deposition (MOCVD) method, a thermal CVD method, a plasma-enhanced CVD method, a molecular-beam epitaxy (MBE) method and a pulse laser deposition (PLD) method. Particularly, the sputtering method is suitable for deposition of an indium-based complex oxide such as ITO.

It is preferred that collecting electrodes 7 and 9 for extracting electric current are formed on the transparent electroconductive layers 6 and 8, respectively. The collecting electrode can be prepared by a known technique such as inkjet printing, screen printing, wire bonding, spraying, or plating. The collecting electrode on the light-receiving side is preferably patterned in a shape of a comb-like pattern or the like for increasing the light receiving area of the solar cell. The collecting electrode on a side opposite to the light-receiving-side may or may not be patterned.

[Solar Cell Module]

The crystalline silicon-based solar cell manufactured by the above is preferably modularized when put into practical use. Modularization of the solar cell is performed by an appropriate method. For example, crystalline silicon-based solar sell module may be obtained by connecting a bus bar via an interconnector such as a tab to a collecting electrode, a plurality of solar cells are connected in series or in parallel, and then encapsulated with an encapsulant and a glass plate.

EXAMPLE

Examples of the present invention will be specifically described below, but the present invention is not limited to the Examples below.

Preparation Examples of Single-Crystalline Silicon Substrate

Example 1

(Anisotropic Etching)

A surface of a 200 μm-thick n-type single-crystalline silicon substrate having a plane orientation (100) on light-receiving surface was cleaned with an alkali, and then immersed for 30 minutes in an anisotropic etchant (aqueous solution of KOH/isopropyl alcohol=3/1 (wt % ratio) held at 80° C.) to form a texture on the surface. Thereafter, the substrate was rinsed with ultrapure water twice.

(Acid Treatment)

The single-crystalline silicon substrate after formation of the texture was immersed for 10 minutes in 5 wt % hydrochloric acid held at 20° C. Thereafter, the substrate was rinsed with ultrapure water twice.

(Ozone Treatment)

The single-crystalline silicon substrate after the acid treatment was immersed for 10 minutes in ozone water (initial concentration: 15 ppm) held at 25° C. while ozone water (ozone concentration at the outlet of an ozone water production apparatus: 15 ppm) was caused to overflow by continuously supplying the ozone water to an ozone water bath for maintaining the ozone concentration. The concentration of ozone water in the ozone water bath was monitored by an ultraviolet ray-type ozone water concentration meter (OZM-5000L manufactured by OKITROTEC CO., LTD), and the result showed that the ozone concentration decreased to 4 ppm immediately after immersion of the silicon substrate, and then increased to a constant concentration of 6 ppm.

The silicon substrate was taken out from the ozone water bath, and then rinsed with ultrapure water twice. The surface of the silicon substrate after the ozone treatment was observed with an atomic force microscope (manufactured by Pacific Nanotechnology Inc.), and the result showed that a pyramidal texture was uniformly formed. A height difference H (texture size) of the texture of the silicon substrate was 2 µm. A curvature radius r of the texture recess was determined by observation with a transmission electron microscope (TEM), and the result showed that the curvature radius r was 1 nm.

(Removal of Oxide Film)

The crystalline silicon substrate after the ozone treatment was immersed for 2 minutes in a 2 wt % HF aqueous solution held at 25° C. Thereafter, the substrate was rinsed with ultrapure water twice. The surface of the silicon substrate after removal of the oxide film by the HF aqueous solution was observed with an atomic force microscope, and the result showed that the height difference H of the texture of the silicon substrate was not changed from that before removal of the oxide film. The curvature radius of the texture recess was 2 nm.

Example 2

In Example 2, the ozone concentration was maintained by bubbling an ozone gas into an ozone water bath instead of continuously supplying ozone water. The ozone concentration decreased to 13 ppm immediately after immersion of the silicon substrate, and then increased to a constant concentration of 15 ppm. Except that the ozone treatment method was changed, the same procedure as in Example 1 was carried out to subject the single-crystalline silicon substrate to anisotropic etching, an acid treatment, an ozone treatment and removal of an oxide film.

Example 3

Except that the temperature in the acid treatment with hydrochloric acid was changed to 60° C., the same procedure as in Example 2 was carried out to subject the single-crystalline silicon substrate to anisotropic etching, an acid treatment, an ozone treatment and removal of an oxide film.

Comparative Examples 1 and 2

After anisotropic etching, an ozone treatment was performed without performing an acid treatment using hydrochloric acid. Except that the above-mentioned change was made, the same procedure as in Examples 1 and 2 was carried out to subject the single-crystalline silicon substrate to anisotropic etching, an ozone treatment and removal of an oxide film.

Comparative Examples 3 and 4

In the acid treatment, $HF/HNO_3$ (5 wt %/60 wt %) aqueous solution was used in place of hydrochloric acid. Except that the above-mentioned change was made, the same procedure as in Examples 1 and 2 was carried out to subject the single-crystalline silicon substrate to anisotropic etching, an acid treatment, an ozone treatment and removal of an oxide film.

Acid treatment conditions, ozone treatment conditions, and shapes of the texture (height of the texture and the curvature radius of the recess) after the ozone treatment and after the HF treatment in the preparation examples of the single-crystalline silicon substrates are shown in Table 1.

<Measurement of Alkali Metal Concentration of Silicon Substrate Surface after Ozone Treatment>

The surface of the silicon substrate after the ozone treatment was dissolved and treated with a mixed liquid (2 $mL/cm^2$) of hydrofluoric acid and nitric acid, and the solution after the treatment was analyzed by inductively coupled plasma source mass spectrometry (ICP-MS). The alkali metal concentration of the solution after treatment of the silicon substrate surface in Example 3 was below a detection limit (0.02 ppm). On the other hand, the alkali metal concentration of the solution after treatment of the silicon substrate surface in Comparative Example 2 was 0.18 ppm.

[Preparation Examples of Heterojunction Solar Cell]

A heterojunction solar cell was prepared by the following method using the single-crystalline silicon substrate in each of the examples and comparative examples.

Example 1A (without Hydrogen Plasma Treatment)

The single-crystalline silicon substrate prepared in Example 1 was introduced into a CVD device, and a light-receiving-side intrinsic amorphous silicon thin-film was deposited to have a thickness of 8 nm on one surface (light receiving surface) of the substrate. Deposition conditions included a substrate temperature of 150° C., a pressure of 120 Pa, a $SiH_4/H_2$ flow ratio of 3/10 and a high-frequency power density of 0.011 $W/cm^2$. On the light-receiving-side intrinsic amorphous silicon thin-film, a p-type amorphous silicon thin-film was deposited to have a thickness of 10 nm. Deposition conditions of the p-type amorphous silicon thin-film included a substrate temperature of 150° C., a pressure of 60 Pa, a $SiH_4$/diluted $B_2H_6$ gas flow ratio of 1/3 and a high-frequency power density of 0.011 $W/cm^2$. A diluted gas, wherein $B_2H_6$ concentration was diluted to 5000 ppm with $H_2$, was used as the diluted $B_2H_6$ gas.

On the other surface (back side) of the single-crystalline silicon substrate, a back-side intrinsic amorphous silicon thin-film was deposited to have a thickness of 8 nm. Deposition conditions of the back-side intrinsic amorphous silicon thin-film were identical to those of the light-receiving-side intrinsic amorphous silicon thin-film. On the back-side intrinsic amorphous silicon thin-film, an n-type amorphous silicon thin-film was deposited to have a thickness of 10 nm. Deposition conditions of the n-type amorphous silicon thin-film included a substrate temperature of 150° C., a pressure of 60 Pa, a $SiH_4$/diluted $PH_3$ gas flow ratio of 1/2 and a high-frequency power density of 0.011 $W/cm^2$. A diluted gas, wherein $PH_3$ concentration was diluted to 5000 ppm with $H_2$, was used as the diluted $PH_3$ gas.

Indium-tin complex oxide (ITO) layers each having a thickness of 100 nm were deposited as transparent electrode layers on the surfaces of the p-type amorphous silicon thin-film and the n-type amorphous silicon thin-film, respectively. For the deposition of ITO, a complex sintered compact of an indium oxide and a tin oxide (containing 5% by weight of tin oxide) was used as a target. Argon was introduced at 100 sccm as a carrier gas, and deposition was carried out under conditions including a substrate temperature of an ambient temperature, a pressure of 0.2 Pa and a high-frequency power density of 0.5 $W/cm^2$.

On each of the surfaces of the transparent electrodes, a silver paste was screen-printed as a collecting electrode.

Thereafter, a heat treatment was carried out at 150° C. under an atmospheric pressure for 60 minutes to solidify the silver paste, so that comb-like pattern collecting electrodes were formed. The interval between the collecting electrodes was set at 10 mm.

Example 1B (with Hydrogen Plasma Treatment)

In Example 1B, an intrinsic amorphous silicon thin-film was formed on a single-crystalline silicon substrate in the following manner: the silicon thin-film was deposited in a part of the total thickness, the deposition was then temporarily stopped, a hydrogen plasma treatment was performed, and the deposition was then performed again to attain the total thickness of the intrinsic amorphous silicon thin-film.

On one surface (light-receiving-side) of the single-crystalline silicon substrate prepared in Example 1, an amorphous silicon thin-film was deposited to have a thickness of 4 nm. After the deposition, plasma discharge was stopped temporarily, and supply of $SiH_4$ was stopped. Only hydrogen gas was introduced into the CVD device for about 30 seconds to replace the gas in the device. Thereafter, plasma discharge was resumed to carry out a hydrogen plasma treatment. Conditions for the hydrogen plasma treatment included a substrate temperature of 150° C., a pressure of 120 Pa, a high-frequency power density of 0.026 W/cm$^2$ and a treatment time of 60 seconds. Thereafter, supply of $SiH_4$ was resumed to further deposit an intrinsic amorphous silicon thin-film in a thickness of 4 nm, so that a light-receiving side amorphous silicon thin-film having a total thickness of 8 nm was formed. Deposition conditions (substrate temperature, pressure, gas flow rate and high-frequency power density) of the intrinsic amorphous silicon thin-film were identical to those in Example 1.

On the other surface (back side) of the single-crystalline silicon substrate, an intrinsic amorphous silicon thin-film was deposited in a thickness of 4 nm in the same manner as described above, a hydrogen plasma treatment was performed, and the deposition was then resumed to deposit an amorphous silicon thin-film having a thickness of 4 nm. Hydrogen plasma treatment conditions were identical to those on the light-receiving side.

Except that a hydrogen plasma treatment was performed along the way of deposition of the intrinsic amorphous silicon thin-film, the same procedure as in Example 1A was carried out to prepare a crystalline silicon-based solar cell.

Examples 2A and 3A and Comparative Examples 1A, 2A, 3A and 4A (without Hydrogen Plasma Treatment)

Except that the single-crystalline silicon substrate prepared in each of Examples 2 and 3 and Comparative Examples 1, 2, 3 and 4 was used, the same procedure as in Example 1A was carried out to prepare a crystalline silicon-based solar cell.

Examples 2B and 3B and Comparative Examples 1B, 2B, 3B and 4B (with Hydrogen Plasma Treatment)

Except that the single-crystalline silicon substrate prepared in each of Examples 2 and 3 and Comparative Examples 1, 2, 3 and 4 was used, the same procedure as in Example 1B was carried out to prepare a crystalline silicon-based solar cell.

The conversion characteristics (short circuit current density (Jsc), open circuit voltage (Voc), fill factor (FF) and conversion efficiency (Eff)) of the crystalline silicon-based solar cells in the Examples and Comparative Examples were measured using a solar simulator. The results are shown in Table 1. The photoelectric conversion characteristics in Table 1 are shown as values relative to those in Comparative Example 1. The increase ratio of conversion efficiency (Eff) based on whether or not a hydrogen plasma treatment is performed during formation of the amorphous intrinsic silicon thin-film in each of Examples and Comparative Examples using the silicon substrate obtained in the same Example or Comparative Example is also shown in Table 1.

Increase ratio(%)=100×{(Eff with hydrogen plasma treatment/Eff without hydrogen plasma treatment)−1}

TABLE 1

| | Silicon substrate cleaning | | | | | | | | Heterojunction solar cell | | | | | |
|---|---|---|---|---|---|---|---|---|---|---|---|---|---|---|
| | Acid treatment conditions | | Ozone treatment conditions | | Texture shape after ozone treatment | | Texture shape after HF treatment | | | | | | | |
| | Acid | Temperature (° C.) | Ozone supply method | Equilibrium concentration (ppm) | Height (nm) | Recess curvature radius (nm) | Height (nm) | Recess curvature radius (nm) | | i-layer plasma treatment | Conversion characteristics | | | Increase ratio |
| | | | | | | | | | | | Jsc | Voc | FF | Eff | |
| Example 1 | HCl | 20 | Ozone water supply | 6 | 2 | 1 | 2 | 2 | Example 1A | Not done | 1.004 | 1.008 | 1.007 | 1.019 | 1.8% |
| | | | | | | | | | Example 1B | Done | 1.006 | 1.013 | 1.018 | 1.037 | |
| Example 2 | HCl | 20 | Ozone gas bubbling | 15 | 2 | 1 | 2 | 2 | Example 2A | Not done | 1.005 | 1.013 | 1.012 | 1.030 | 1.5% |
| | | | | | | | | | Example 2B | Done | 1.006 | 1.015 | 1.024 | 1.046 | |
| Example 3 | HCl | 60 | Ozone gas bubbling | 15 | 2 | 1 | 2 | 2 | Example 3A | Not done | 1.004 | 1.015 | 1.019 | 1.038 | 3.3% |
| | | | | | | | | | Example 3B | Done | 1.006 | 1.031 | 1.034 | 1.072 | |
| Comparative Example 1 | — | | Ozone water supply | 6 | 2 | 1 | 2 | 2 | Comparative Example 1A | Not done | 1 | 1 | 1 | 1 | 0.9% |
| | | | | | | | | | Comparative Example 1B | Done | 0.997 | 1.005 | 1.007 | 1.009 | |

TABLE 1-continued

| | Silicon substrate cleaning | | | | | | | | | | | | | | |
|---|---|---|---|---|---|---|---|---|---|---|---|---|---|---|---|
| | Acid treatment conditions | | Ozone treatment conditions | | Texture shape after ozone treatment | | Texture shape after HF treatment | | Heterojunction solar cell | | | | | | |
| | Acid | Temperature (° C.) | Ozone supply method | Equilibrium concentration (ppm) | Height (nm) | Recess curvature radius (nm) | Height (nm) | Recess curvature radius (nm) | | i-layer plasma treatment | Conversion characteristics | | | | Increase ratio |
| | | | | | | | | | | | Jsc | Voc | FF | Eff | |
| Comparative Example 2 | — | | Ozone gas bubbling | 15 | 2 | 1 | 2 | 2 | Comparative Example 2A | Not done | 1.002 | 1.008 | 1.008 | 1.018 | 0.5% |
| | | | | | | | | | Comparative Example 2B | Done | 1.001 | 1.01 | 1.012 | 1.023 | |
| Comparative Example 3 | HF/HNO₃ | 20 | Ozone water supply | 6 | 2 | 200 | 2 | 200 | Comparative Example 3A | Not done | 0.989 | 1.011 | 1.009 | 1.009 | 0.4% |
| | | | | | | | | | Comparative Example 3B | Done | 0.989 | 1.014 | 1.01 | 1.013 | |
| Comparative Example 4 | HF/HNO₃ | 20 | Ozone gas bubbling | 15 | 2 | 200 | 2 | 200 | Comparative Example 4A | Not done | 0.991 | 1.015 | 1.012 | 1.018 | 0.1% |
| | | | | | | | | | Comparative Example 4B | Done | 0.988 | 1.016 | 1.015 | 1.019 | |

It is apparent that solar cells including the substrates in Examples 1 to 3 have an improved open circuit voltage (Voc) and fill factor (FF), and higher conversion efficiency as compared to solar cells including substrates in Comparative Examples 1 and 2 in which acid cleaning was not performed before the ozone treatment.

It is apparent that in the silicon substrate in Example 3, the impurity concentration is reduced by performing acid cleaning before the ozone treatment because the surface of the silicon substrate has an alkali metal concentration equal to or less than 1/10 of that in Comparative Example 2 as described above. These results show that by performing acid cleaning before the ozone treatment, the amount of impurities brought into the ozone water bath is reduced, and therefore the amount of impurities on the silicon substrate surface is reduced to contribute to improvement of the open circuit voltage (Voc) and fill factor (FF).

In Comparative Examples 3 and 4 where an ozone treatment was performed after an acid treatment with hydrofluoric acid and nitric acid, the curvature radius of the texture recess is larger as compared to Examples. This is because isotropic etching was caused to proceed by an acid treatment using an oxidizing acid. It is apparent that solar cells including the substrates in Comparative Examples 3 and 4 are comparable in open circuit voltage (Voc) and fill factor (FF) but inferior in short circuit current density (Jsc) to solar cells including the substrates in Examples 1 to 3. This may be because by the acid treatment, recesses of the texture were rounded, leading to an increase in reflectance of the substance.

On the other hand, it is apparent that in Examples 1 to 3 where acid treatment with hydrochloric acid was performed, the curvature radius of the texture recess is comparable to that when an acid treatment is not performed (Comparative Examples 1 and 2), and the resulting solar cell has an improved short circuit current density (Jsc) and higher conversion efficiency as compared to Comparative Examples 3 and 4 where texture recess has large curvature radius.

Comparison between Example 1 and Example 2 shows that as compared to a method including supplying ozone water, a method including bubbling an ozone gas is capable of increasing the ozone concentration of ozone water, and thus exhibits a higher ozone cleaning effect, so that a solar cell having a high open circuit voltage (Voc) and fill factor (FF) is obtained. In the present invention, since acid cleaning is performed before the ozone treatment, and the amount of impurities brought into the ozone water bath is small, the impurity concentration can be kept low even when ozone water is not replaced by overflowing of the ozone water. Thus, by bubbling an ozone gas, the ozone treatment can be performed while a high ozone concentration is maintained, so that a solar cell having excellent conversion efficiency is obtained, and also the amount of ozone waste water can be reduced.

It is considered that in Example 3, the temperature in acid cleaning was increased to further improve the effect of acid cleaning, so that the amount of impurities brought into the ozone water bath was reduced, and therefore a solar cell with higher efficiency was obtained.

When attention is given to a difference in conversion characteristics based on whether or not the amorphous silicon thin-film is subjected to a plasma treatment in preparation of a solar cell, it is apparent that in Examples 1 to 3, the increase ratio of conversion efficiency with a hydrogen plasma treatment is higher as compared to Comparative Examples 1 to 4. Comparison between Example 1A and Comparative Example 3A where a hydrogen plasma treatment was not performed, shows that the open circuit voltage (Voc) and the fill factor (FF) are higher in Comparative Example 3A. Comparison between Example 1B and Comparative Example 3B, where a hydrogen plasma treatment was performed, shows that the open circuit voltage (Voc) and the fill factor (FF) in Example 1B were equivalent to or higher than those in Comparative Example 3B.

Comparison between a solar cell including the substrate in Example 2 and a solar cell including the substrate in Comparative Example 4 showed the same tendency with regard to whether or not a hydrogen plasma treatment was performed. These results show that an acid treatment using hydrochloric acid increases the short circuit current density (Jsc) of a solar cell because recesses of the texture are not rounded, and by subjecting the amorphous silicon thin-film to a hydrogen plasma treatment, the open circuit voltage (Voc) and the fill factor (FF) are considerably improved, so that a solar cell having high conversion efficiency is obtained. It is apparent that Example 3 where an acid treatment was performed at a high temperature attains a more remarkable effect of improving the open circuit voltage (Voc) and the fill factor (FF) by a hydrogen plasma treatment.

DESCRIPTION OF REFERENCE CHARACTERS 1 single-crystalline silicon substrate
2, 4 intrinsic silicon-based thin-film
3, 5 conductive silicon-based thin-film
6, 8 transparent electroconductive layer
7, 9 collecting electrode
100, 200 ozone treatment apparatus
110, 210 ozone water bath
112, 212 ozone water
116 silicon substrate
121, 122 discharge pipe
126, 127 drainage water supply pipe
130 drainage water tank
144 ozone water generator
244 ozone gas generator
146 ozone water supply pipe
246 ozone gas supply pipe
149 impurity removing unit

The invention claimed is:

1. A method for manufacturing a crystalline silicon substrate for a solar cell, the method comprising, in order:
   anisotropically etching a single-crystalline silicon substrate by treating a surface of the single-crystalline silicon substrate with an alkali solution to form a texture on the surface of the single-crystalline silicon substrate;
   treating the surface of the single-crystalline silicon substrate with a solution consisting essentially of hydrochloric acid; and
   treating the surface of the single-crystalline silicon substrate with ozone water.

2. The method according to claim 1, wherein treating the surface of the single-crystalline silicon substrate comprises immersing the single-crystalline silicon substrate in an ozone water bath.

3. The method according to claim 2, wherein an ozone gas is supplied to the ozone water bath to adjust a concentration of the ozone water.

4. The method according to claim 1, wherein a concentration of the hydrochloric acid is 1% by weight to 15% by weight.

5. The method according to claim 1, wherein a temperature of the hydrochloric acid is 30° C. to 80° C.

6. The method according to claim 1, further comprising:
   treating the surface of the single-crystalline silicon substrate with hydrofluoric acid to remove an oxide film from the surface of the single-crystalline silicon substrate after treating the surface of the single-crystalline silicon substrate with ozone water.

7. The method according to claim 1, wherein treating the surface of the single-crystalline silicon substrate with ozone water causes a size of the texture on the surface of the single-crystalline silicon substrate to be 0.1 µm or more and less than 5 µm, and a curvature radius of a recess of the texture to be less than 5 nm.

8. The method according to claim 1, wherein the single-crystalline silicon substrate is immersed in an acidic solution bath to treat the surface of the single-crystalline silicon substrate with the acidic solution bath.

9. The method according to claim 8, wherein the single-crystalline silicon substrate is immersed in the acidic solution bath for 5-20 minutes.

10. The method according to claim 1, wherein an oxide film is formed on the surface of the single-crystalline silicon substrate by treating the surface of the single-crystalline silicon substrate with ozone water.

11. The method according to claim 10, wherein the oxide film has a thickness of 0.2 nm to 5.0 nm.

12. The method according to claim 1, wherein treating the surface of the single-crystalline silicon substrate with ozone water causes a size of the texture on the surface of the single-crystalline silicon substrate to be 0.1 µm or more and less than 5 µm, and a curvature radius of a recess of the texture to be less than 5 nm,
   the method further comprising treating the surface of the single-crystalline silicon substrate with hydrofluoric acid to remove an oxide film from the surface of the single-crystalline silicon substrate after treating the surface of the single-crystalline silicon substrate with ozone water, wherein a curvature radius of the recess of the texture is less than 5 nm after treating with the hydrofluoric acid.

13. A method for manufacturing a crystalline silicon-based solar cell, the method comprising, in order:
   anisotropically etching a single-crystalline silicon substrate by treating a surface of the single-crystalline silicon substrate with an alkali solution to form a texture on the surface of the single-crystalline silicon substrate;
   treating the surface of the single-crystalline silicon substrate with a solution consisting essentially of hydrochloric acid;
   treating the surface of the single-crystalline silicon substrate with ozone water; and
   depositing a conductive non-single-crystalline silicon-based thin-film on the texture-formed surface of the single-crystalline silicon substrate.

14. The method according to claim 13, further comprising: depositing a transparent electroconductive layer on the conductive non-single-crystalline silicon-based thin-film.

15. The method according to claim 13, further comprising:
   depositing an intrinsic non-single-crystalline silicon thin-film on the single-crystalline silicon substrate after preparing the single-crystalline silicon substrate and before depositing the conductive non-single-crystalline silicon-based thin-film.

16. The method according to claim 15, wherein after deposition of at least a part of the intrinsic non-single-crystalline silicon thin-film and before deposition of the conductive non-single-crystalline silicon-based thin-film, the intrinsic non-single-crystalline silicon thin-film is subjected to a plasma treatment in a gas atmosphere mainly composed of hydrogen.

17. The method according to claim 13, wherein treating the surface of the single-crystalline silicon substrate with ozone water causes a size of the texture on the surface of the single-crystalline silicon substrate to be 0.1 µm or more and less than 5 µm, and a curvature radius of a recess of the texture to be less than 5 nm,
   the method further comprising:
   treating the surface of the single-crystalline silicon substrate with hydrofluoric acid to remove an oxide film from the surface of the single-crystalline silicon substrate after treating the surface of the single-crystalline silicon substrate with ozone water, wherein a curvature radius of the recess of the texture is less than 5 nm after treating with the hydrofluoric acid;

depositing an intrinsic non-single-crystalline silicon thin-film on the single-crystalline silicon substrate after preparing the single-crystalline silicon substrate and before depositing the conductive non-single-crystalline silicon-based thin-film; and depositing a transparent electroconductive layer on the conductive non-single-crystalline silicon-based thin-film.

18. A method for manufacturing a crystalline silicon-based solar cell module comprising at least two crystalline silicon-based solar cells, the method comprising, in order:

anisotropically etching a single-crystalline silicon substrate by treating a surface of the single-crystalline silicon substrate with an alkali solution to form a texture on the surface of the single-crystalline silicon substrate;

treating the surface of the single-crystalline silicon substrate with a solution consisting essentially of hydrochloric acid;

treating the surface of the single-crystalline silicon substrate with ozone water; and depositing a conductive non-single-crystalline silicon-based thin-film on the texture-formed surface of the single-crystalline silicon substrate, thereby forming a first crystalline silicon-based solar cell of the at least two crystalline silicon-based solar cells;

electrically connecting the first crystalline silicon-based solar cell and a second crystalline silicon-based solar cell of the at least two crystalline silicon-based solar cells; and encapsulating the at least two crystalline silicon-based solar cells with an encapsulant.

* * * * *